(12) United States Patent
Jung et al.

(10) Patent No.: US 9,941,253 B1
(45) Date of Patent: Apr. 10, 2018

(54) SEMICONDUCTOR PACKAGES INCLUDING INTERCONNECTORS AND METHODS OF FABRICATING THE SAME

(71) Applicant: Sk hynix Inc., Icheon-si Gyeonggi-do (KR)

(72) Inventors: Yeon Seung Jung, Suwon-si (KR); Jin Woo Park, Icheon-si (KR); Joo Wan Hong, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/597,484

(22) Filed: May 17, 2017

(30) Foreign Application Priority Data

Nov. 17, 2016 (KR) .................... 10-2016-0153526

(51) Int. Cl.
*H01L 25/065* (2006.01)
*H01L 23/538* (2006.01)
*H01L 25/00* (2006.01)

(52) U.S. Cl.
CPC ...... *H01L 25/0657* (2013.01); *H01L 25/0652* (2013.01); *H01L 25/50* (2013.01); *H01L 2225/06513* (2013.01); *H01L 2225/06517* (2013.01); *H01L 2225/06527* (2013.01); *H01L 2225/06544* (2013.01); *H01L 2225/06568* (2013.01); *H01L 2225/06582* (2013.01)

(58) Field of Classification Search
CPC . H01L 25/0657; H01L 25/0652; H01L 25/50; H01L 2225/06513; H01L 2225/06517; H01L 2225/06568; H01L 2225/06582; H01L 2225/06544; H01L 2225/06593
See application file for complete search history.

(56) References Cited

U.S. PATENT DOCUMENTS 9,269,700 B2   2/2016  Koopmans et al.
9,379,074 B2 * 6/2016  Uzoh ..................... H01L 24/10

* cited by examiner

*Primary Examiner* — Jasmine Clark
(74) *Attorney, Agent, or Firm* — William Park & Associates Ltd.

(57) ABSTRACT

A semiconductor package and or method of fabricating a semiconductor package may be provided. The semiconductor package may include a package substrate. The semiconductor package may include a first semiconductor die coupled to the package substrate by first interconnectors. The semiconductor package may include a second semiconductor die coupled to the first semiconductor die by second interconnectors. The second semiconductor die may be coupled to the substrate.

17 Claims, 10 Drawing Sheets

SEMICONDUCTOR PACKAGES INCLUDING INTERCONNECTORS AND METHODS OF FABRICATING THE SAME

CROSS-REFERENCE TO RELATED APPLICATIONS

The present application claims priority under 35 U.S.C 119(a) to Korean Application No. 10-2016-0153526, filed on Nov. 17, 2016, which is incorporated herein by references in its entirety.

BACKGROUND

1. Technical Field

Embodiments of the present disclosure may generally relate to semiconductor packages and, more particularly, to semiconductor packages including interconnectors and methods of fabricating the same.

2. Related Art

Attempts to realize faster operating semiconductor packages, larger capacity semiconductor packages and multi-functional semiconductor packages have resulted in embedding a plurality of semiconductor devices in a single package. System-in-package (SIP) techniques have been proposed to embed a plurality of semiconductor devices in a single package. Interposer interconnection techniques may be used in the realization of the SIP consisting of at least one microprocessor die and at least one memory die. In addition, TSV techniques may be used in the realization of the SIP consisting of a plurality of memory dies which are vertically stacked to provide for a larger capacity memory package.

SUMMARY

According to an embodiment, there is provided a method of fabricating a semiconductor package. According to an embodiment, a semiconductor package may be provided. The semiconductor package may include a package substrate. The semiconductor package may include a first semiconductor die coupled to the package substrate by first interconnectors. The semiconductor package may include a second semiconductor die coupled to the first semiconductor die by second interconnectors. The second semiconductor die may be coupled to the substrate.

DETAILED DESCRIPTION

Figure 1:
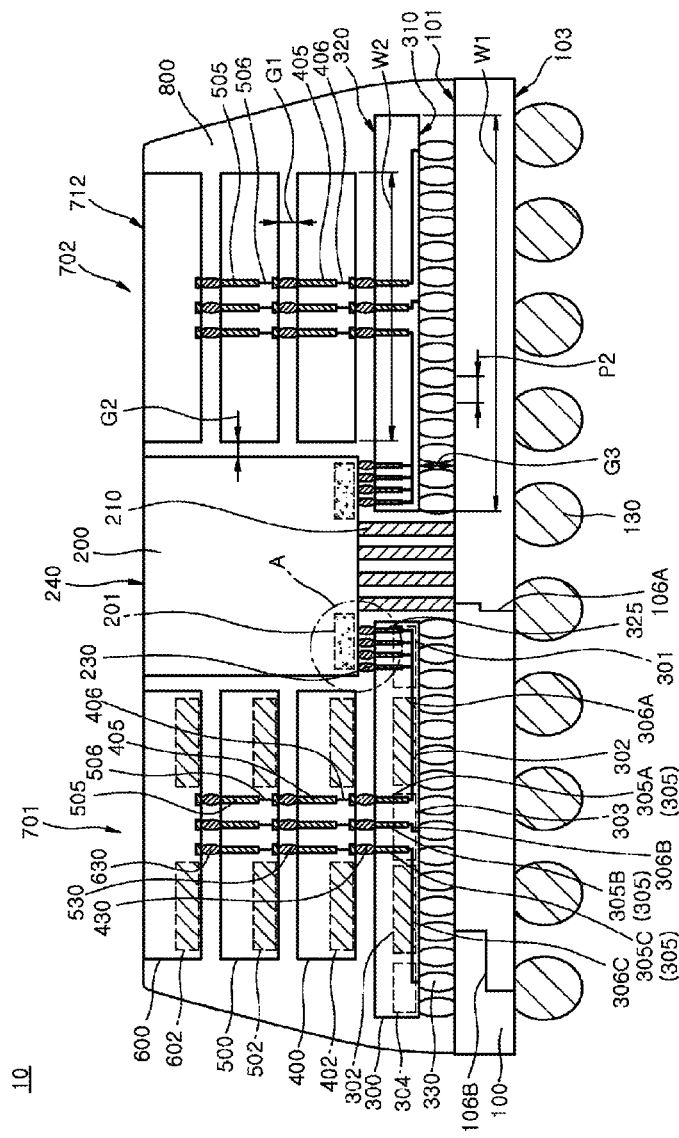
FIG. 1 is a cross-sectional view illustrating a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence.

Embodiments of the present disclosure do not use any interposer interconnectors and provides semiconductor packages configured to have an SIP structure. Some of the semiconductor packages according to the embodiments may be provided in a package form including at least two semiconductor dies which are different in function. The semiconductor dies (also, referred to as semiconductor chips) may correspond to semiconductor devices which are obtained by separating a semiconductor substrate such as a wafer into a plurality of pieces using a die sawing process. In some cases, each of the semiconductor dies may have a package form (e.g., a wafer level package form) in which a semiconductor device having integrated circuits is encapsulated.

Same reference numerals refer to same elements throughout the specification. Thus, even though a reference numeral is not mentioned or described with reference to a drawing, the reference numeral may be mentioned or described with reference to another drawing. In addition, even though a reference numeral is not illustrated in a drawing, it may be mentioned or described with reference to another drawing.

Figure 2:
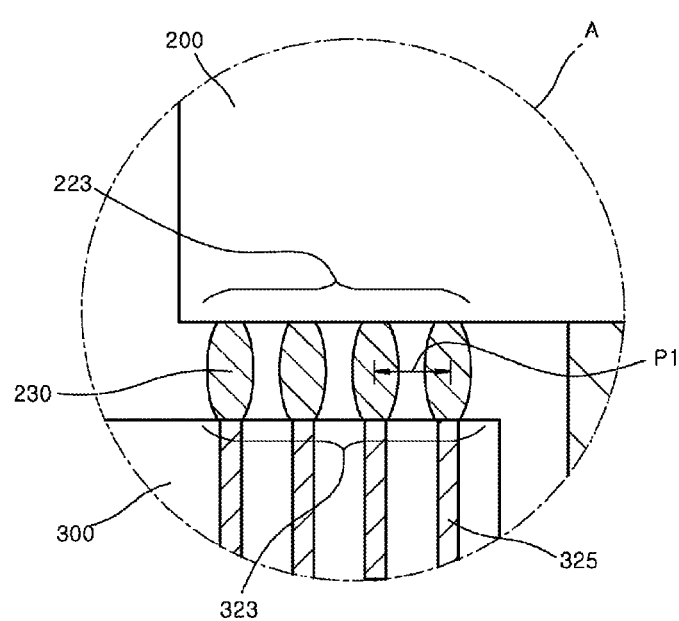
FIG. 2 is an enlarged view illustrating a portion 'A' of FIG. 1.
Figure 3:
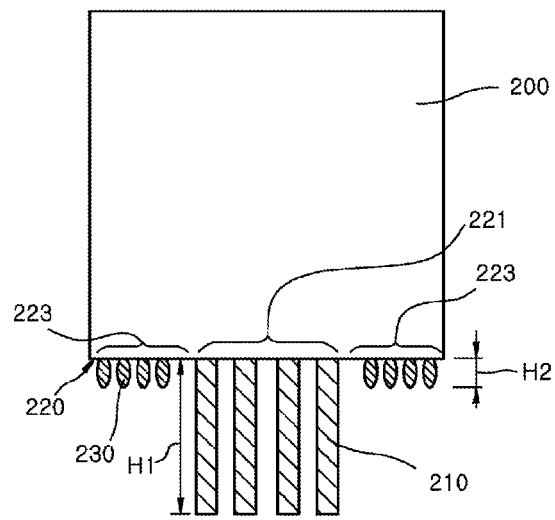
FIG. 3 is a cross-sectional view illustrating first interconnectors and second interconnectors attached to a first semiconductor die of the semiconductor package illustrated in FIG. 1.
Figure 4:
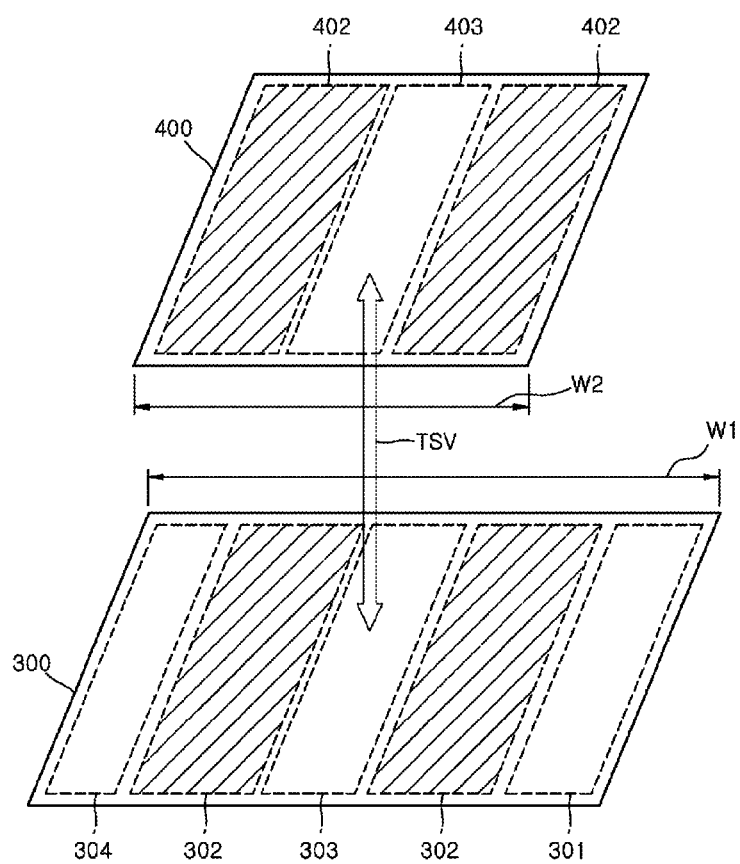
FIG. 4 is a schematic view illustrating a second semiconductor die and a third semiconductor die included in the semiconductor package of FIG. 1.

FIG. 1 schematically illustrates a cross-sectional view of a semiconductor package 10 according to an embodiment. FIG. 2 is an enlarged view illustrating a portion 'A' of FIG. 1. FIG. 3 schematically illustrates a cross-sectional view of a first semiconductor die 200 included in the semiconductor package 10 illustrated in FIG. 1, and FIG. 4 illustrates a schematic view of a second semiconductor die 300 and a third semiconductor die 400 included in the semiconductor package 10 of FIG. 1.

Referring to FIG. 1, the semiconductor package 10 may be configured to include the first semiconductor die 200 which is mounted on a package substrate 100. The second semiconductor die 300 may be disposed on the package substrate 100, and the third semiconductor die 400 may be vertically stacked on the second semiconductor die 300. Optionally, a fourth semiconductor die 500 may be vertically and additionally stacked on the third semiconductor die 400, or a fifth semiconductor die 600 may be vertically and additionally stacked on the fourth semiconductor die 500. The second to fifth semiconductor dies 300, 400, 500 and 600 may constitute a first die building 701 which is located at one side of the first semiconductor die 200. A second die building 702 may also be disposed at another side of the first semiconductor die 200 opposite to the first die building 701 so that the first and second die buildings 701 and 702 are symmetric with respect to the first semiconductor die 200. The second die building 702 may include a plurality of semiconductor dies which are vertically stacked to correspond to the second to fifth semiconductor dies 300, 400, 500 and 600. The second to fifth semiconductor dies 300, 400, 500 and 600 may be electrically connected to each other using a through silicon via (TSV) interconnection technique. The plurality of semiconductor dies constituting the second die building 702 may also be electrically connected to each other using a TSV interconnection technique.

The first semiconductor die 200, the first die building 701 and the second die building 702 may constitute the semiconductor package 10 having an SIP form. The first semiconductor die 200 may be a logic chip, and at least one of the first and second die buildings 701 and 702 may be configured to include memory dies that receive data from the first semiconductor die 200 or output the data to the first semiconductor die 200. The first semiconductor die 200 may be an application specific integrated circuit (ASIC) chip including a microprocessor, a microcontroller, a digital signal processing core or an interface unit for exchanging signals. Alternatively, the first semiconductor die 200 may be a central processing unit (CPU) or a graphics processing unit (GPU). The first semiconductor die 200 may be provided in a system-on-chip (SoC) form.

Each of the first and second die buildings 701 and 702 may be configured to include memory devices. The first die building 701 may be configured to include high bandwidth memory (HBM) devices that can communicate with the first semiconductor die 200 using a high bandwidth interfacing technique. For example, the second to fifth semiconductor dies 300, 400, 500 and 600 constituting the first die building 701 may correspond to semiconductor memory dies including memory cell regions 302, 402, 502 and 602, respectively. Each of the memory cell regions 302, 402, 502 and 602 may be configured to include a plurality of memory cells. Each of the second to fifth semiconductor dies 300, 400, 500 and 600 may correspond to a DRAM device. The memory cell regions 302, 402, 502 and 602 may store data outputted from the first semiconductor die 200, or the data stored in the memory cell regions 302, 402, 502 and 602 may be supplied to the first semiconductor die 200.

In an embodiment, the second semiconductor die 300 of the first die building 701 may be a base die or a master die without the memory cell region 302. The master die may be configured to include a second interface region 301 interfacing with a first interface region 201 of the first semiconductor die 200, a TSV area 303 in which TSV interconnectors are disposed, and a direct access area 304. A configuration of the second semiconductor die 300 will be described later.

Referring to FIGS. 1 and 2, the second semiconductor die 300 may include the second interface region 301 interfacing with the first interface region 201 of the first semiconductor die 200. The first interface region 201 may be included in the first semiconductor die 200 to control the first and second die buildings 701 and 702 and to perform data communication between the first semiconductor die 200 and the die buildings 701 and 702. The first and second semiconductor dies 200 and 300 may be disposed so that an edge region 223 of the first semiconductor die 200 overlaps with an edge region 323 of the second semiconductor die 300 and the edge region 223 of the first semiconductor die 200 is spaced apart from the edge region 323 of the second semiconductor die 300.

The first interface region 201 may be disposed in the edge region 223 of the first semiconductor die 200, and the second interface region 301 may be disposed in the edge region 323 of the second semiconductor die 300. Since the first interface region 201 of the first semiconductor die 200 is located to vertically overlap with the edge region 323 of the second semiconductor die 300, a physical distance between the first interface region 201 and the second interface region 301 may be reduced. Accordingly, a length of a signal path or a data path between the first interface region 201 and the second interface region 301 may also be reduced. This may lead to improvement of a data communication speed between the first semiconductor die 200 and the second semiconductor die 300.

The first interface region 201 may include an interface circuit for performing data communication with the second semiconductor die 300, for example, a physical layer (PHY) for interfacing with the second semiconductor die 300. Similarly, the second interface region 301 may also include an interface circuit for performing data communication with the first semiconductor die 200, for example, a physical layer (PHY) for interfacing with the first semiconductor die 200. The second interface region 301 may be included in the second semiconductor die 300 to send the data stored in the memory cell regions 302, 402, 502 and 602 of the second to fifth semiconductor dies 300, 400, 500 and 600 to the first semiconductor die 200 or to send the data outputted from the first semiconductor die 200 to the second to fifth semiconductor dies 300, 400, 500 and 600. Since the second to fifth semiconductor dies 300, 400, 500 and 600 communicate with the first semiconductor die 200 through the second interface region 301 included in the second semiconductor die 300, the second semiconductor die 300 may act as a master die that controls the third to fifth semiconductor dies 400, 500 and 600 corresponding to slave dies.

Referring to FIGS. 1 and 3, first interconnectors 210 and second interconnectors 230 having a bump shape may be disposed on a first surface 220 of the first semiconductor die 200 facing a first surface 101 of the package substrate 100 to electrically connect the first semiconductor die 200 to the package substrate 100 and the second semiconductor die 300. The first surface 220 of the first semiconductor die 200 may correspond to an active surface on which integrated circuits are disposed.

A height of the first interconnectors 210 may be different from a height of the second interconnectors 230. The first interconnectors 210 may correspond to interconnection members that electrically connect the package substrate 100 to the first semiconductor die 200. The second interconnectors 230 may correspond to interconnection members that electrically connect the second semiconductor die 300 to the first semiconductor die 200. The first interconnectors 210 may be comprised of bumps having a first length H1 (corresponding to a first height) which is taller than the second interconnectors 230 to reach the first surface 101 of the package substrate 100.

The second interconnectors 230 may be comprised of bumps having a second length H2 which is less than the first length H1 of the first interconnectors 210. The second interconnectors 230 may be in contact with a first surface 320 of the edge region 323 of the second semiconductor die 300 to realize a chip-to-chip bonding between the first semiconductor die 200 and the second semiconductor die 300. Each of the second interconnectors 230 may be disposed between the edge region 223 of the first semiconductor die 200 and the edge region 323 of the second semiconductor die 300 to electrically connect the first semiconductor die 200 to the second semiconductor die 300.

The second interconnectors 230 may be located to overlap with the edge region 223 in which the first interface region 201 is disposed and the edge region 323 in which the second interface region 301 is disposed. Thus, the second interconnectors 230 may provide interfacing paths that vertically connect the first interface region 201 to the second interface region 301. Accordingly, a signal path between the first interface region 201 to the second interface region 301 may be reduced by the second interconnectors 230.

Referring to FIG. 3, the second interconnectors 230 may be disposed on both edges 223 of the first semiconductor die 200, and the first interconnectors 210 may be disposed on a central region 221 between the pair of edges 223 of the first semiconductor die 200. Thus, as illustrated in FIG. 1, the first interconnectors 210 may pass through an empty space between the two adjacent second semiconductor dies 300 to be bonded to the first surface 101 of the package substrate 100. The first interconnectors 210 may be spaced apart from sidewalls of the edge regions 323 of the second semiconductor dies 300 and may be in contact with the package substrate 100. The first interconnectors 210 may be comprised of conductive bumps or conductive posts having the first length H1.

Referring again to FIG. 1, the second semiconductor die 300 may include first through vias 325 which are respectively connected to the second interconnectors 230. The first through vias 325 may be located to overlap with the second interface region 301. The first through vias 325 may be disposed in the edge region 323 of the second semiconductor die 300. The first through vias 325 may correspond to TSVs that extend from the first surface 320 of the edge region 323 of the second semiconductor die 300 toward an internal region of the second semiconductor die 300. The first through vias 325 may provide signal paths that connect the second interconnectors 230 to the second interface region 301 of the second semiconductor die 300. The first through vias 325 and the second interconnectors 230 may provide interfacing paths that connect the second interface region 301 to the first interface region 201.

Referring still to FIG. 1, the second semiconductor die 300 may include a TSV interconnection structure for electrically and signally connecting the second semiconductor die 300 to the third to fifth semiconductor dies 400, 500 and 600. The second semiconductor die 300 may include second through vias 305 that are disposed in the TSV area 303 to constitute the TSV interconnection structure. The TSV area 303 is an area in which the second through vias 305 are disposed. Referring to FIG. 4, the second semiconductor die 300 may include the second interface region 301, the memory cell region 302 and the TSV area 303. In addition, the second semiconductor die 300 may include the direct access area 304 to act as a master die. The third semiconductor die 400 may correspond to a slave die that includes the memory cell region 402 acting as a data bank and a TSV area 403 overlapping with third through vias 405. The third through vias 405 in the TSV area 403 of the third semiconductor die 400 and the second through vias 305 in the TSV area 303 of the second semiconductor die 300 may be connected to each other to constitute the TSV interconnection structure.

For the purpose of ease and convenience in explanation, an example of a layout of the cell region 302, the TSV area 303 and the direct access area 304 included in the second semiconductor die 300 is illustrated in FIG. 4. However, the layout of the cell region 302, the TSV area 303 and the direct access area 304 may not be limited to FIG. 4. Optionally, the cell region 302, the TSV area 303 and the direct access area 304 may be disposed to be different from the layout of FIG. 4. Alternatively, the second semiconductor die 300 may be configured to function as a master die that substantially controls slave dies without the cell region 302. For example, the second semiconductor die 300 may be designed to function as a base die or a master die including the TSV area 303, the direct access area 304 and the second interface region 301 without the cell region 302.

The fourth semiconductor die (500 of FIG. 1) may be configured to function as another slave die that includes the memory cell region (502 of FIG. 1) acting as a data bank and a TSV area overlapping with third through vias (405 of FIG. 1), like the third semiconductor die 400. The fifth semiconductor die (600 of FIG. 1) may also be configured to function as still another slave die that includes the memory cell region (602 of FIG. 1)

The direct access area 304 of the second semiconductor die 300 may be an area including circuits and interconnectors that directly send signals outputted from the package substrate 100 to the second to fifth semiconductor dies 300, 400, 500 and 600. The direct access area 304 may be configured to include a test circuit that can directly access to the second to fifth semiconductor dies 300, 400, 500 and 600 to test the second to fifth semiconductor dies 300, 400, 500 and 600.

Referring to FIG. 1, the second through vias 305 may include, for example but not limited to, a few hundred vias or a few thousand vias to connect the second to fifth semiconductor dies 300, 400, 500 and 600 to each other. The second through vias 305 may be comprised of TSVs that extend from the first surface 320 of the second semiconductor die 300 toward an internal region of the second semiconductor die 300. A second surface 310 of the second semiconductor die 300 opposite to the third semiconductor die 400 may be an active surface on which circuits and interconnectors are disposed, and the first surface 320 may correspond to a backside surface of the second semiconductor die 300.

First redistributed lines 306A may be disposed on the second surface 310 of the second semiconductor die 300 to electrically and signally connect the first through vias 325 to second through vias 305A corresponding to a first group of the second through vias 305. Signals transmitted from the first interface region 201 to the second interface region 301 through the first through vias 325 may be transmitted to the second through vias 305A through the first redistributed lines 306A. Since the second through vias 305A are connected to the third semiconductor die 400, the signals transmitted to the second through vias 305A may be transmitted to the third semiconductor die 400. However, data stored in the third semiconductor die 400 may be transmitted to the first interface region 201 through the second through vias 305A and the first redistributed lines 306A.

Third interconnectors 330 may be disposed on the second surface 310 of the second semiconductor die 300 to electrically and signally connect the second semiconductor die 300 to the package substrate 100. The third interconnectors 330 may be bumps. First internal interconnection lines 306B may be disposed in the second semiconductor die 300 to be adjacent to the second surface 310. The first internal interconnection lines 306B may connect some of the third interconnectors 330 to second through vias 305B corresponding to a second group of the second through vias 305.

The first internal interconnection lines 306B may be disposed to electrically connect the second through vias 305B to the third interconnectors 330 overlapping with the TSV area 303. The first internal interconnection lines 306B may include a power supply line and a ground line that are not data transmission lines or signal transmission lines.

Second redistributed lines 306C may be disposed on the second surface 310 of the second semiconductor die 300 to connect some of the third interconnectors 330 to second through vias 305C corresponding to a third group of the second through vias 305. The second redistributed lines 306C may be disposed to electrically connect the second through vias 305C to the third interconnectors 330 overlapping with the direct access area 304 spaced apart from the TSV area 303. The second redistributed lines 306C may be disposed to electrically connect the third interconnectors 330 non-overlapping with the TSV area 303 to the second through vias 305C located in the TSV area 303.

The third interconnectors 330 may be arrayed to have a pitch P2 which is greater than a pitch P1 of the second interconnectors 230 connected to the first through vias 325. The third interconnectors 330 may be uniformly distributed on an entire portion of the second surface 310 of the second semiconductor die 300. Since the third interconnectors 330 are uniformly distributed on an entire portion of the second surface 310 of the second semiconductor die 300, the third interconnectors 330 may support an entire portion of the second semiconductor die 300. That is, since the third interconnectors 330 are uniformly distributed on an entire portion of the second semiconductor die 300, the second semiconductor die 300 may be stably supported by the third interconnectors 330. Thus, when the second semiconductor die 300 is attached to the package substrate 100 by the third interconnectors 330 using a thermal compress bonding technique, a pressure may be uniformly applied to the second semiconductor die 300 to prevent a specific portion of the second semiconductor die 300 from warping.

The package substrate 100 may include an interconnection structure that is comprised of interconnection traces. The package substrate 100 may be a printed circuit board (PCB). The package substrate 100 may include a base layer comprised of an organic material, and the interconnection traces of the package substrate 100 may be comprised of a conductive material. Outer connectors 130 for connecting the semiconductor package 10 to an external device may be disposed on a second surface 103 of the package substrate 100 opposite to the first and second semiconductor dies 200 and 300. The outer connectors 130 may be solder balls.

Interconnection traces constituting the interconnection structure of the package substrate 100 may include a first internal trace 106A connecting one of the first interconnectors 210 to one of the outer connectors 130 and a second internal trace 106B connecting one of the third interconnectors 330 to another one of the outer connectors 130.

Referring again to FIG. 1, the second semiconductor die 300 and the third semiconductor die 400 may be electrically and signally connected to each other by fourth interconnectors 430. The fourth interconnectors 430 may be located to overlap with the TSV area 303 of the second semiconductor die 300. The third semiconductor die 400 may include second internal interconnection lines 406 which are respectively connected to the fourth interconnectors 430 and the third through vias 405 which are respectively connected to the second internal interconnection lines 406. The second internal interconnection lines 406 and the third through vias 405 may constitute a TSV interconnection structure. The third semiconductor die 400 may be disposed on the second semiconductor die 300 so that the third through vias 405 overlap with the TSV area 303 of the second semiconductor die 300. The fourth interconnectors 430 may be disposed to overlap with the TSV area 303 of the second semiconductor die 300. The fourth interconnectors 430 may be disposed to overlap with the second through vias 305 of the second semiconductor die 300, respectively. The third semiconductor die 400 may be stacked on the second semiconductor die 300 so that the edge regions 323 of the second semiconductor die 300 laterally protrude from sidewalls of the third semiconductor die 400. In such a case, the second semiconductor die 300 may have a width W1 which is greater than a width W2 of the third semiconductor die 400.

The third semiconductor die 400 and the fourth semiconductor die 500 may be electrically and signally connected to each other by fifth interconnectors 530. The fifth interconnectors 530 may be located to overlap with the TSV area 303 of the second semiconductor die 300. The fourth semiconductor die 500 may include third internal interconnection lines 506 which are respectively connected to the fifth interconnectors 530 and the fourth through vias 505 which are respectively connected to the third internal interconnection lines 506. The third internal interconnection lines 506 and the fourth through vias 505 may constitute a TSV interconnection structure. The fourth semiconductor die 500 may be disposed on the third semiconductor die 400 so that the fourth through vias 505 overlap with the TSV area 303 of the second semiconductor die 300.

The fourth semiconductor die 500 and the fifth semiconductor die 600 may be electrically and signally connected to each other by sixth interconnectors 630. The sixth interconnectors 630 may be located to overlap with the TSV area 303 of the second semiconductor die 300. The fifth semiconductor die 600 may also include a TSV interconnection structure comprised of through vias (not illustrated), like the fourth semiconductor die 500.

Although FIG. 1 illustrates an example in which three semiconductor dies (i.e., third to fifth semiconductor dies 400, 500 and 600) are stacked on the second semiconductor die 300, the present disclosure is not limited to FIG. 1. That is, in some embodiments, four or eight or more semiconductor dies may be stacked on the second semiconductor die 300. For example, in some embodiments one or more semiconductor dies may be stacked on the second semiconductor die 300.

The semiconductor package 10 may further include an encapsulant layer 800 that is disposed on the first surface 101 of the package substrate 100 to cover and protect the first and second die buildings 701 and 702. The encapsulant layer 800 may extend to fill a gap G1 between the second to fifth semiconductor dies 300, 400, 500 and 600. The encapsulant layer 800 may extend to fill a gap G2 between the first semiconductor die 200 and the die buildings 701 and 702. The encapsulant layer 800 may also extend to fill a gap G3 between the package substrate 100 and the second semiconductor dies 300. The encapsulant layer 800 may be disposed to expose upper surfaces 712 of the first and second die buildings 701 and 702, that is, upper surfaces of the fifth semiconductor dies 600. The encapsulant layer 800 may be disposed to expose an upper surface (i.e., a second surface 240) of the first semiconductor die 200. Since the second surface 240 of the first semiconductor die 200 and the upper surfaces 712 of the fifth semiconductor dies 600 are exposed by the encapsulant layer 800, a heat emission efficiency of the semiconductor package 10 may be improved. The encapsulant layer 800 may be disposed to cover sidewalls of at least the first and third semiconductor dies 200 and 400.

FIGS. 5 to 9 are cross-sectional views illustrating a method of fabricating a semiconductor package according to an embodiment. The embodiment illustrated in FIGS. 5 to 9 may correspond to an example of various methods of fabricating the semiconductor package 10 illustrated in FIG. 1.

Figure 5:
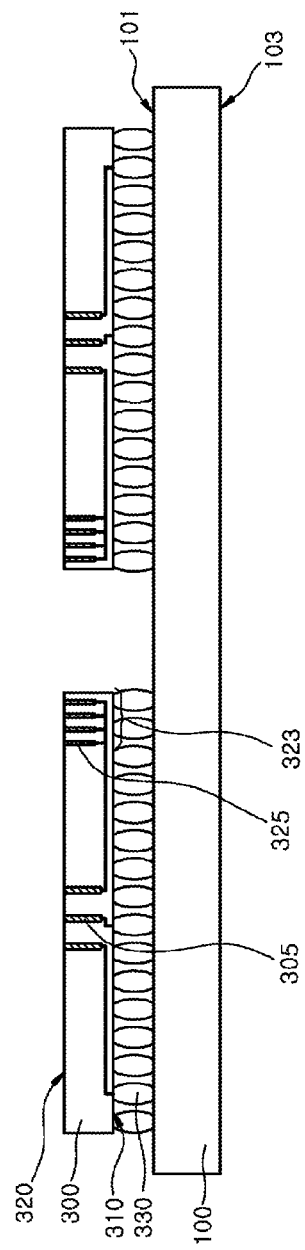
FIGS. 5 to 9 are cross-sectional views illustrating a method of fabricating a semiconductor package according to an embodiment.

Referring to FIG. 5, a pair of second semiconductor dies 300 may be mounted on a first surface 101 of a package substrate 100 so that second surfaces 310 of the pair of second semiconductor dies 300 face the first surface 101 of the package substrate 100. The second semiconductor dies 300 may be attached to the first surface 101 of the package substrate 100 using third interconnectors 330. The pair of second semiconductor dies 300 adjacent to each other may be mounted on the package substrate 100 so that an edge region 323 of one of the pair of second semiconductor dies 300 faces an edge region 323 of the other of the pair of second semiconductor dies 300. First through vias 325 may be formed in the edge region 323 of each of the pair of second semiconductor dies 300. First ends of the first through vias 325 may be exposed at the first surfaces 320 of the second semiconductor dies 300. Second through vias 305 may be formed in each of the second semiconductor dies 300 to be spaced apart from the first through vias 325, and first ends of the second through vias 305 may be exposed at the first surfaces 320 of the second semiconductor dies 300.

Figure 6:
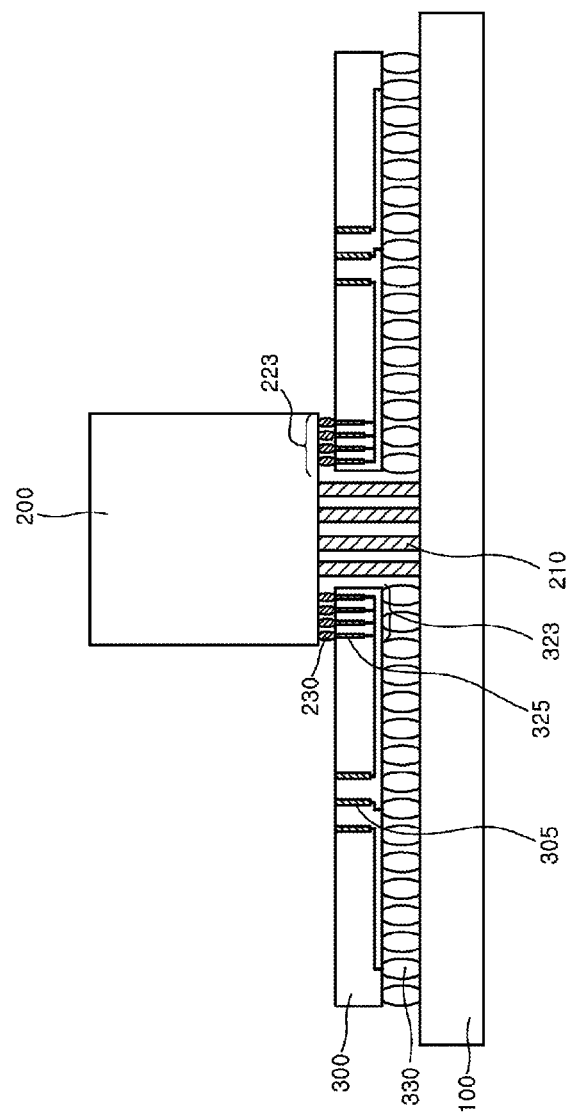

Referring to FIG. 6, a first semiconductor die 200 may be mounted on the first surface 101 (see FIG. 5) of the package substrate 100. The first semiconductor die 200 may be connected to the package substrate 100 by first interconnectors 210. The first semiconductor die 200 may be disposed on the package substrate 100 so that both edge regions 223 of the first semiconductor die 200 overlap with the edge regions 323 of the pair of second semiconductor dies 300 respectively. The first semiconductor die 200 may be bonded to the pair of second semiconductor dies 300 using a chip-to-chip bonding technique with second interconnectors 230. The edge region 323 of each of the pair of second semiconductor dies 300 may be connected to one of the edge regions 223 of the first semiconductor die 200 using the second interconnectors 230. The second interconnectors 230 may be connected to the first through vias 325 of the pair of second semiconductor dies 300, respectively. The first interconnectors 210 may be formed to have a length (i.e., a height) which is different from a length (i.e., a height) of the second interconnectors 230.

Figure 7:
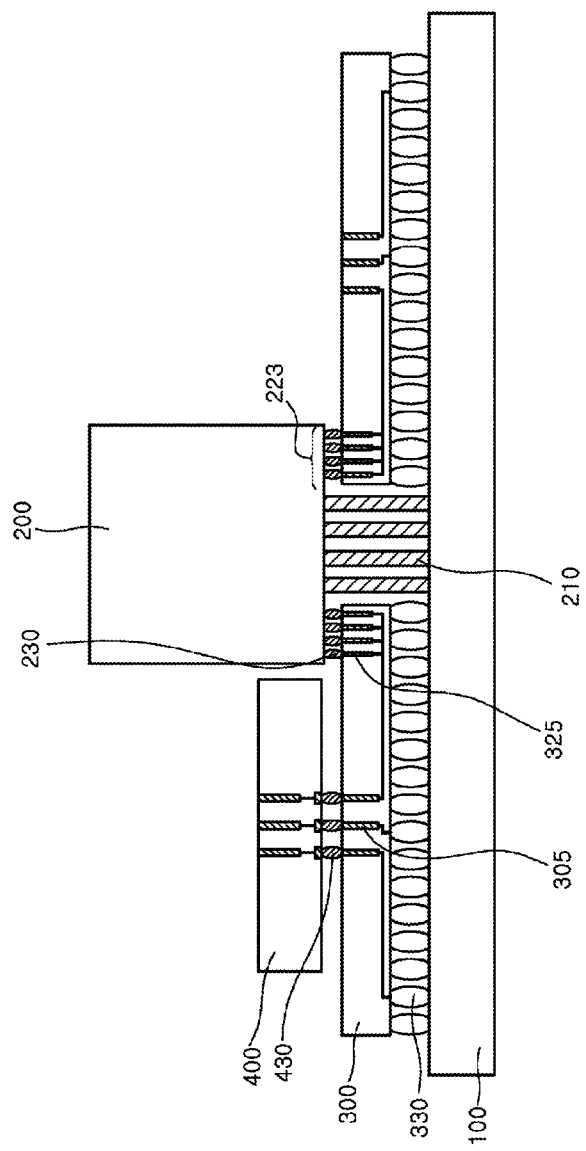

Referring to FIG. 7, a third semiconductor die 400 may be disposed on one of the pair of second semiconductor dies 300, and the third semiconductor die 400 may be connected to the second semiconductor die 300 using fourth interconnectors 430. The fourth interconnectors 430 may be connected to the second through vias 305 formed in the second semiconductor die 300, respectively.

Figure 8:
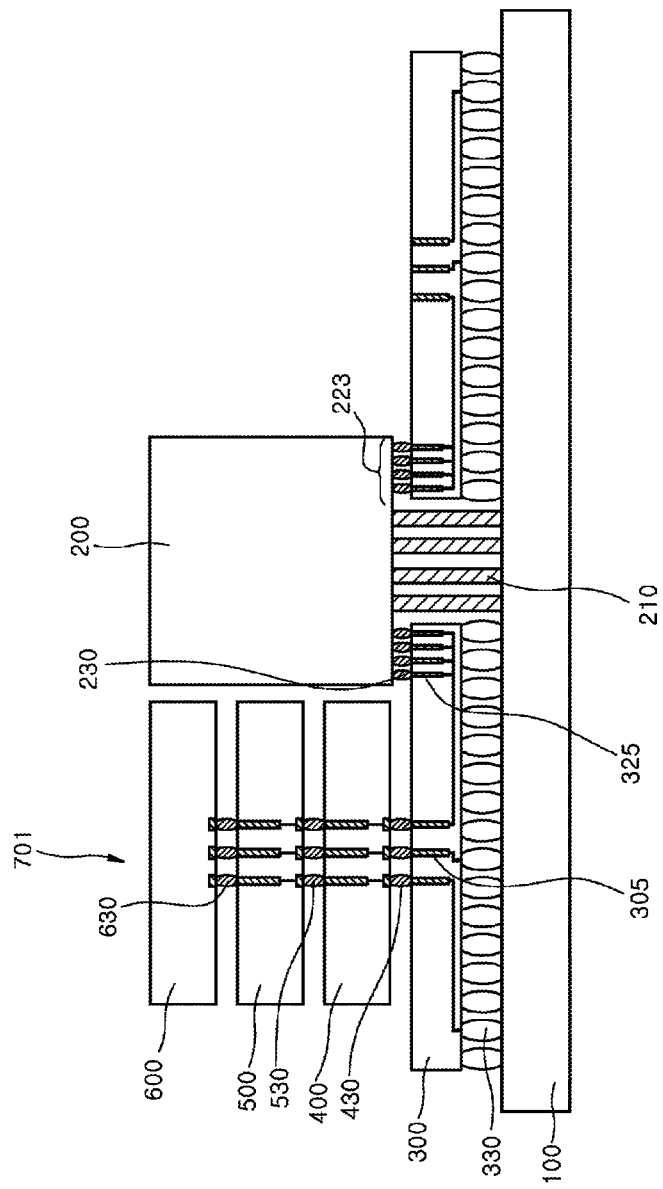

Referring to FIG. 8, a fourth semiconductor die 500 may be disposed on the third semiconductor die 400, and the third and fourth semiconductor dies 400 and 500 may be connected to each other by fifth interconnectors 530. A fifth semiconductor die 600 may be disposed on the fourth semiconductor die 500, and the fourth and fifth semiconductor dies 500 and 600 may be connected to each other by sixth interconnectors 630. The second to fifth semiconductor dies 300, 400, 500 and 600, which are sequentially stacked at one side of the first semiconductor die 200, may constitute a first die building 701.

Figure 9:
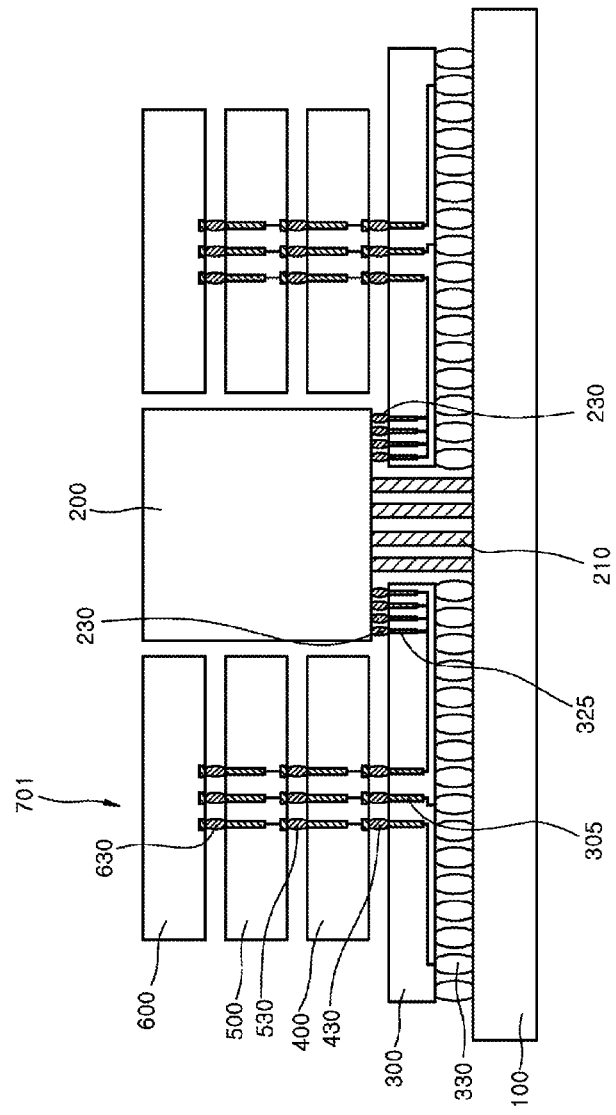

Referring to FIG. 9, another third semiconductor die 400, another fourth semiconductor die 500 and another fifth semiconductor die 600 may also be sequentially stacked on the other second semiconductor die 300 disposed at another side of the first semiconductor die 200 opposite to the first die building 701 to constitute a second die building 702. The first and second die buildings 701 and 702 may be formed to be symmetric with respect to the first semiconductor die 200. The first and second die buildings 701 and 702 may be formed to be substantially symmetric with respect to the first semiconductor die 200.

Subsequently, Referring to FIG. 1, an encapsulant layer 800 may be formed on the first surface 101 of the package substrate 100 to cover the semiconductor dies 200, 300, 400, 500 and 600, and outer connectors 130 may be attached to a second surface 103 of the package substrate 100 opposite to the first semiconductor die 200. As a result, a semiconductor package (10 of FIG. 1) may be fabricated.

Figure 10:
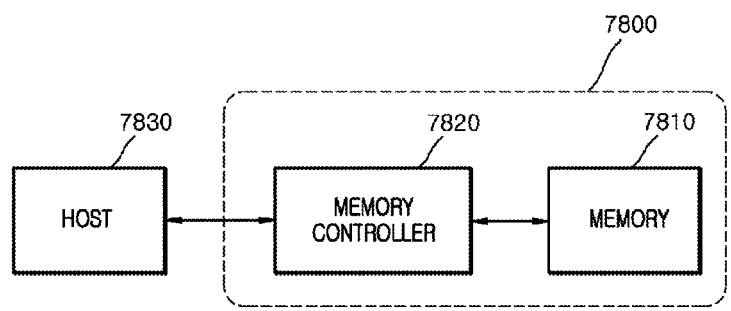
FIG. 10 is a block diagram illustrating an electronic system employing a memory card including at least one of semiconductor packages according to some embodiments.

FIG. 10 is a block diagram illustrating an electronic system including a memory card 7800 including at least one of the semiconductor packages according to the embodiments. The memory card 7800 includes a memory 7810 such as but not limited to a nonvolatile memory device, and a memory controller 7820. The memory 7810 and the memory controller 7820 may store data or read stored data. The memory 7810 and/or the memory controller 7820 include one or more semiconductor chips disposed in a semiconductor package according to an embodiment.

The memory 7810 may include a nonvolatile memory device to which the technology of the embodiments of the present disclosure is applied. The memory controller 7820 may control the memory 7810 such that stored data is read out or data is stored in response to a read and write (read/write) request from a host 7830.

Figure 11:
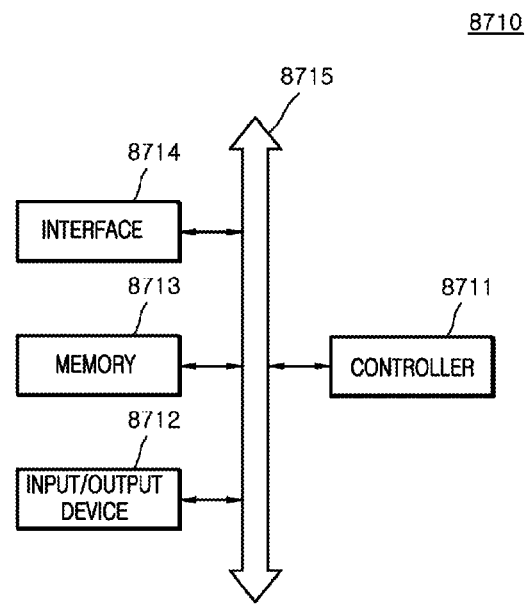
FIG. 11 is a block diagram illustrating an electronic system including at least one of semiconductor packages according to some embodiments.

FIG. 11 is a block diagram illustrating an electronic system 8710 including at least one of the packages according to the embodiments. The electronic system 8710 may include a controller 8711, an input and output (input/output) device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission and reception (transmission/reception) system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   a package substrate;
   a first semiconductor die coupled to the package substrate by first interconnectors;
   a second semiconductor die configured to have an edge region overlapping with an edge region of the first semiconductor die, the second semiconductor die coupled to the edge region of the first semiconductor by second interconnectors, and the second semiconductor die coupled to the package substrate by third interconnectors; and
   a third semiconductor die stacked on the second semiconductor die,
   wherein a length of the first interconnectors is different from a length of the second interconnectors, and
   wherein the second semiconductor die has a width which is greater than a width of the third semiconductor die.

2. The semiconductor package of claim 1, wherein the second interconnectors are bumps having a length which is less than a length of the first interconnectors.

3. The semiconductor package of claim 1, wherein the second interconnectors are disposed to vertically couple the edge region of the first semiconductor die to the edge region of the second semiconductor die.

4. The semiconductor package of claim 1,
   wherein the edge region of the second semiconductor die is disposed between the edge region of the first semiconductor die and the package substrate; and
   wherein the first interconnectors are disposed to pass by a sidewall of the edge region of the second semiconductor die and are spaced apart from the sidewall of the edge region of the second semiconductor die.

5. A semiconductor package comprising:
   a package substrate;
   a first semiconductor die coupled to the package substrate by first interconnectors;
   a second semiconductor die configured to have an edge region overlapping with an edge region of the first semiconductor die, the second semiconductor die coupled to the edge region of the first semiconductor by second interconnectors, and the second semiconductor die coupled to the package substrate by third interconnectors; and
   a third semiconductor die stacked on the second semiconductor die,
   wherein a length of the first interconnectors is different from a length of the second interconnectors,
   wherein the second semiconductor die includes:
   first through vias disposed in the edge region of the second semiconductor die and connected to the second interconnectors; and
   second through vias disposed in the second semiconductor die spaced apart from the first through vias and connected to the third semiconductor die, and
   wherein the second semiconductor die further includes a first redistributed line connecting at least one of the first through vias to at least one of the second through vias.

6. The semiconductor package of claim 5, wherein the second semiconductor die further includes a second redistributed line connecting at least one of the second through vias to at least one of the third interconnectors that do not overlap with the second through vias.

7. The semiconductor package of claim 5, wherein the second semiconductor die further includes a first interface region having a physical layer that is disposed to overlap with the first through vias and to exchange data with the first semiconductor die.

8. The semiconductor package of claim 7, wherein the first semiconductor die includes a second interface region having a physical layer that is disposed in the edge region of the first semiconductor die to overlap with the first interface region and to exchange data with the second semiconductor die.

9. The semiconductor package of claim 5, further comprising fourth interconnectors that respectively overlap with the second through vias to electrically connect the second through vias to the third semiconductor die.

10. The semiconductor package of claim 9, wherein the third semiconductor die includes third through vias that are disposed to overlap with the second through vias and are electrically connected to the fourth interconnectors.

11. The semiconductor package of claim 1, wherein the third semiconductor die is disposed on the second semiconductor die so that the edge region of the second semiconductor die laterally protrudes further than a sidewall of the third semiconductor die.

12. The semiconductor package of claim 1, wherein the third interconnectors are arrayed to have a pitch which is greater than a pitch of the second interconnectors.

13. The semiconductor package of claim 1, wherein the third interconnectors are substantially uniformly distributed on an entire portion of a surface of the second semiconductor die.

14. A semiconductor package comprising:
   a package substrate;
   a first semiconductor die coupled to the package substrate by first interconnectors;
   a second semiconductor die configured to have an edge region overlapping with an edge region of the first semiconductor die, the second semiconductor die coupled to the edge region of the first semiconductor by second interconnectors, and the second semiconductor die coupled to the package substrate by third interconnectors; and
   a third semiconductor die stacked on the second semiconductor die,
   wherein a length of the first interconnectors is different from a length of the second interconnectors, and
   wherein the third semiconductor die is a memory die including a memory cell region that stores data which are transmitted to the first semiconductor die.

15. The semiconductor package of claim 14, wherein the second semiconductor die includes a memory cell region that stores data which are transmitted to the first semiconductor die.

16. A semiconductor package comprising:
- a package substrate;
- a first semiconductor die coupled to the package substrate by first interconnectors;
- a second semiconductor die configured to have an edge region overlapping with an edge region of the first semiconductor die, the second semiconductor die coupled to the edge region of the first semiconductor by second interconnectors, and the second semiconductor die coupled to the package substrate by third interconnectors;
- a third semiconductor die stacked on the second semiconductor die; and an encapsulant layer that substantially covers sidewalls of the second and third semiconductor dies and substantially exposes an upper surface of the first semiconductor die.

17. A semiconductor package comprising:
- a package substrate;
- a first semiconductor die coupled to the package substrate by first interconnectors;
- a second semiconductor die configured to have an edge region overlapping with a first edge region of the first semiconductor die, the second semiconductor die coupled to the first edge region of the first semiconductor by second interconnectors, and the second semiconductor die coupled to the package substrate by third interconnectors; and
- a third semiconductor die configured to have an edge region overlapping with a second edge region of the first semiconductor die, the third semiconductor die coupled to the second edge region of the first semiconductor by third interconnectors, and the third semiconductor die coupled to the package substrate by fourth interconnectors,
- wherein the first semiconductor die is coupled to the package substrate by the first interconnectors disposed on a central region of the first semiconductor die between the first and second edge regions of the first semiconductor die and passing through an empty space between the second and third semiconductor dies.

* * * * *